INVENTORS.
THOMAS A. LONGO
and MARVIN MILLER
BY David M. Keay
AGENT.

United States Patent Office 3,312,880

Patented Apr. 4, 1967

3,312,880

FOUR-LAYER SEMICONDUCTOR SWITCHING DEVICE HAVING TURN-ON AND TURN-OFF GAIN

Thomas A. Longo, Winchester, and Marvin Miller, Newton, Mass., assignors to Sylvania Electric Products Inc., a corporation of Delaware Filed Dec. 12, 1962, Ser. No. 244,075

5 Claims. (Cl. 317—235)

This invention relates to semiconductor electrical translating devices. More particularly, it is concerned with semiconductor switching devices of the type known as PNPN triodes.

Semiconductor devices having four successive layers, or zones, of semiconductor material of alternating conductivity type providing a three-junction device are well known. These devices, commonly referred to as PNPN switches, have a voltage-current characteristic which includes a negative resistance region intermediate high impedance and low impedance positive resistance regions. This characteristic permits their use in a variety of switching applications.

The first PNPN switches were two-terminal devices, or diodes, having ohmic connections to the two opposite end layers. The diodes were switched from operation in one positive resistance region to the other by changing the voltage applied across the terminals.

PNPN devices have been developed by the addition of a third connection to one of the intermediate layers of the four-layer device structure. The first PNPN triodes provided a "thyratron-like" type of action in which a small electrical current applied at the third or gate connection switched the device from the high impedance-low conduction condition to the low impedance-high conduction condition. That is, a small current applied to the gate connection would initiate the flow of a much greater current through the device between the two end terminals. However, it was necessary to reduce the flow of current through the device to a very low level, as by opening the external circuit, in order to restore the device to the high impedance-low conduction condition. Further developments have led to PNPN triodes which may be employed as bistable devices capable of being triggered from the high impedance or "off" condition to the low impedance or "on" condition and also from the on condition to the off condition by the application of currents at the gate connection which are small relative to the currents being switched.

PNPN triodes of the foregoing trigger type possess certain electrical characteristics which it is desired to optimize in order to provide effective switching action. The resistance of the device when it is in the on or low impedance condition should be very low, and the resistance of the device when it is in the off or high impedance condition should be very high. The turn-on and turn-off gains which are the ratios of the current through the device being switched on and off to the currents which must be applied to the gate connection in order to accomplish each of the switching actions should be large.

In addition, it is desirable that the voltage between the two end terminals at which breakover or switching from the off state to the on state occurs by virtue of the applied voltage with no current at the gate be high. The holding current through the device which is defined as the minimum current which will sustain the device in its on condition and prevent it from switching off should be low. Also, the ability of the device to be switched rapidly from one state to the other is considered a desirable characteristic for switches.

Although PNPN triodes are available in which certain of the aforementioned characteristics are satisfactory, frequently they are attained by sacrificing the quality of other characteristics.

It is an object of the present invention, therefore, to provide an improved semiconductor switching device.

It is another object of the invention to provide a PNPN semiconductor triode switching device having improved electrical characteristics.

It is also an object of the invention to provide a method for producing four-layer switching triodes having improved electrical characteristics.

Briefly, a semiconductor device in accordance with the foregoing objects of the invention comprises a body of semiconductor material having four layers of alternating conductivity type, each layer with a particular physical configuration and resistivity profile. Terminal connections are applied to the two opposite end layers and a gate or control connection is affixed to a particular one of the intermediate layers. The device includes a first layer of one conductivity type material which is thin and of very high resistivity. The next layer is of the opposite conductivity type and is of moderate resistivity. This layer is also thin. The third layer is of the one conductivity type and forms a graded junction with the layer of the opposite conductivity type. This layer is extremely thin. The fourth layer is a thin region of the opposite conductivity type and forms a graded junction with the third layer. Low resistance electrodes are connected to the first and fourth layers, and to the third layer. The second layer is left free of any connection.

PNPN devices which fulfill the foregoing description are fabricated according to the method of the invention by employing a novel combination of processing steps. A body of semiconductor material of one conductivity type of very low resistivity is provided as a substrate, or block, upon which the four active layers of the device are fabricated. A thin, extremely high resistivity epitaxial layer of semiconductor material of the same conductivity type is grown on the low resistivity, or degenerate, substrate. A second epitaxial layer of the opposite conductivity type of moderate resistivity is grown on the first epitaxial layer. A material capable of imparting the one type of conductivity is then diffused into one portion of the second epitaxial layer to provide a region of the one conductivity type forming a graded junction with a thin region of the opposite conductivity type remaining between the diffused region and the first epitaxial layer. In a second diffusion step a material capable of imparting the opposite type of conductivity is diffused into one portion of the first diffused region to reconvert that portion to a graded region of the opposite conductivity type. An extremely thin unreconverted portion of the first diffused region of the one conductivity type remains intermediate a homogenous layer of the opposite conductivity type and a graded layer of the opposite conductivity type. Ohmic connections are then affixed to the degenerate substrate and to the two layers formed by diffusion.

Additional objects, features, and advantages of the invention will be apparent from the following detailed discussion and the accompanying drawings wherein.

In the figures the various parts of the semiconductor elements are not drawn to scale. Certain dimensions are exaggerated in relation to other dimensions in order to present a clearer understanding of the invention.

Figure 1:
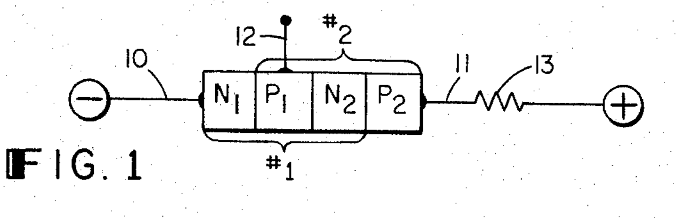
FIG. 1 is a schematic representation of a PNPN semiconductor triode.
Figure 2:
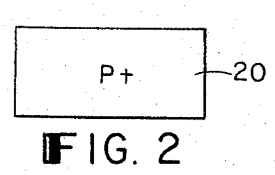
FIGS. 2 through 7 are elevational views in cross-section illustrating stages in the fabrication of a PNPN triode in accordance with the method of the invention.

A PNPN triode is represented schematically in FIG. 1. The device includes a first layer or zone $N_1$ of N-type conductivity semiconductor material, a second zone $P_1$ of P-type conductivity, a third zone $N_2$ of N-type conductivity, and a fourth zone $P_2$ of P-type conductivity. A first low resistance terminal connection 10 is made to the $N_1$ zone and a second low resistance terminal connection 11 is made to the $P_2$ zone. An ohmic gate or control connection 12 is made to the $P_1$ zone.

A device of this type is illustrated in a typical switching circuit with the second terminal 11 at the $P_2$ zone connected through the load 13 to the positive terminal of a supply source. The first terminal 10 at the $N_1$ zone is shown connected to the negative terminal of the supply source. Pulses of the appropriate polarity are applied to the control connection at the $P_1$ zone to switch the device on and off. Although for the purposes of the present discussion a PNPN triode is shown in which the gate connection is made to the intermediate P-type zone, it is well understood that the teachings herein are equally applicable to PNPN triodes in which the conductivity type of the zones is reversed and the gate connection is made to an N-type zone.

For ease in understanding the operation of a PNPN triode of the nature illustrated in FIG. 1, the device may be considered as equivalent to a complementary pair of transistors with the bases and collectors cross-coupled. The first transistor section, labeled #1 in FIG. 1, includes the first three zones $N_1P_1N_2$, and the second transistor section, labeled #2 in FIG. 1, includes the last three zones $P_2N_2P_1$. The $N_1$ zone is the emitter region of the first transistor section and the $N_1$–$P_1$ junction is its emitter junction. The $P_2$ zone is the emitter region of the second transistor section and the $N_2$–$P_2$ junction is its emitter junction. The $P_1$–$N_2$ junction is the collector junction for both transistor sections.

Each transistor section has a current gain or alpha and the alpha of the device is equal to their sum ($\alpha_T=\alpha_1+\alpha_2$). The alpha of the device ($\alpha_T$) varies with current through the device from less than unity in the off condition to greater than unity in the on condition. The alpha is equal to unity when the current through the device is at the holding current, which is the minimum current through the device sufficient to sustain the device in the on condition.

In order to switch the device from the off to the on condition, gate current is introduced into the device at the $P_1$ zone sufficient to cause an increase in current flow through the device to a level which raises the alpha of the device to unity. Current flow at the emitter of the second transistor section is equal to the current at the gate multiplied by $$\frac{\alpha_1}{1-\alpha_1-\alpha_2}$$

Therefore, in order that the gate turn-on current may be small, the value of $\alpha_1$ should become high as current starts to flow through the device. It is desirable that $\alpha_1$ be quite small in the off condition so that the leakage current will be low. The value of $\alpha_1$ should then increase very rapidly with increasing current through the device so that only a small current need be introduced at the $P_1$ zone to raise the value of $\alpha_T$ above unity and switch the device on.

The turn-off gain of the device, which is the ratio of the on current through the device being switched off to the current at the $P_1$ zone necessary to accomplish the switching, is approximately equal to $$\frac{\alpha_1}{\alpha_1+\alpha_2-1}$$

Thus, in order for the turn-off gain to be high, $\alpha_1$ should be high and $\alpha_2$ should be low so that $\alpha_1+\alpha_2$ is only slightly greater than unity, when the device is in the on condition. With the $\alpha_T$, or the sum of $\alpha_1$ and $\alpha_2$, only slightly greater than unity, the device does not operate in a heavily saturated condition. For this reason the gate current which must be withdrawn at the $P_1$ zone to turn the device off is small.

In PNPN triodes according to the invention the first transistor section ($N_1P_1N_2$) is of a construction which provide a high value of $\alpha_1$. The alpha of a transistor is made high by making the minority carrier injection efficiency of the emitter and the minority carrier transport factor of the base high. The injection efficiency of the emitter of the first transistor section is high by virtue of the emitter region $N_1$ being of low resistivity with respect to the base region $P_1$. By protecting the surface edges of the emitter junction $N_1$–$P_1$ so that they are not exposed to the atmosphere at the surface of the device, improved junction perfection with low concentration of surface recombination centers is obtained. These conditions contribute to high emitter injection efficiency at low current. Thus the gate current necessary to turn the device on and the holding current are reduced. The base transport factor of the first transistor section is made high by making the base region $P_1$ extremely thin with respect to the diffusion length of minority carriers in this base region so that the concentration of minority carriers does not drop off appreciably between the emitter junction and the collector junction.

The alpha of the second transistor section ($\alpha_2$) is made low in PNPN triodes according to the invention by making the emitter injection efficiency and the base transport factor low. Low injection efficiency is obtained by employing an emitter region $P_2$ which has a high value of sheet resistance compared with that of the base region $N_2$. The sheet resistance of the emitter region $P_2$ is made high by the use of material of extremely high resistivity. The sheet resistance of the base region $N_2$ is made low relative to that of the emitter region $P_2$ by the use of material of lower resistivity.

Because of other considerations to be discussed hereinbelow, the resistivity of the base region $N_2$ is made higher than it would be if obtaining an extremely low value of emitter injection efficiency were the only factor dependent on the $N_2$ zone. In order to obtain a satisfactory ratio of resistivities between the regions, the base region $N_2$ is made of moderate resistivity and the emitter region $P_2$ of extremely high resistivity.

The ratio of sheet resistances also depends on the relative thicknesses of the emitter and base regions. Desirably the base region $N_2$ should be thick and the emitter region $P_2$ thin. Because of the effect which the thickness of the base region $N_2$ has on other characteristics, however, it is not made thicker than of the order of a diffusion length of the minority carriers within it. The emitter region $P_2$ desirably shuold be relatively thin, but if its thickness is less than of the order of a diffusion length, the emitter injection efficiency will be increased because of effects which will be discussed hereinbelow.

The base transport factor of the second transistor section is made small by making the base region $N_2$ no thinner than approximately one diffusion length. Thus the density of minority carriers injected at the emitter junction $N_2$–$P_2$ becomes much smaller at the collector junction $P_1$–$N_2$. The collector junction $P_1$–$N_2$ is made small in area compared to the emitter junction $N_2$–$P_2$ in order to further reduce the base transport factor. In addition, recombination centers are introduced into the base region $N_2$ and the emitter junction $N_2$–$P_2$ in order to reduce the lifetime and consequently the diffusion length of minority carriers in the base region and the injection efficiency of the emitter junction. Since the diffusion length is reduced, the base region $N_2$ can be made thin and yet not be less than a diffusion length.

In devices according to the invention the resistance of a device in the on-state or condition of low impedance is low because the zones which are of high resistivity material are thin, thus keeping the series resistance low. Since the series resistance of the device is small, a relatively large current will flow through the device in the on condition. In certain prior art devices having a relatively thick $N_2$ region suitable values of on-state resistance could only be obtained by conductivity modulation in the device. This result was achieved by constructing the device with the value of $\alpha_T$ much greater than one so that a high forward bias was obtained across the collector junction $P_1$–$N_2$ due to the on current in the device. This technique of obtaining a low on-state resistance by operating the device heavily saturated required sacrificing other electrical characteristics, particularly a satisfactory value of turn-off gain.

The resistance of the device in the off condition is made high by providing a collector junction $P_1$–$N_2$ in which the edges of the junction are not exposed to the atmosphere. Suitable protection at the intersection of the junction with the surface prevents the formation of recombination centers adjacent the junction which would cause leakage current to flow across the junction.

The breakover voltage of a PNPN device is directly related to the collector junction breakdown voltage. In devices according to the invention this voltage is made reasonably high by virtue of the material on each side of the collector junction $P_1$–$N_2$. The use of high resistivity material for the $N_2$ zone provides high breakdown voltage. However, as explained hereinabove, to keep the value of $\alpha_2$ low, the resistivity of the $N_2$ region is low relative to that of the $P_2$ region. In order to provide a satisfactory balance between the requirements of the two characteristics, the $N_2$ region is fabricated of moderate resistivity material.

The speed at which the device can be switched between the two stable states is relatively high in devices according to the invention. The speed of switching off is particularly improved over prior art devices because of the above-mentioned factors which prevent the device from operating vary far into saturation. Since there is no conductivity modulation in the on state, the minority carrier density is low and the few stored carriers are quickly removed when the switching action starts.

Various stages in the fabrication of a PNPN triode in accordance with the invention are illustrated in FIGS. 2 through 7. A body or substrate 20 of single crystal low resistivity P-type semiconductor material is provided as a support on which the device structure is fabricated. In the following example silicon is employed as the semiconductor material although the teachings are obviously applicable to other semiconductor material. The substrate is produced as by known techniques of growing bodies of single crystal silicon and is heavily doped to provide a low resistivity, or degenerate, material. Although the substrate is desirably in the form of a relatively large slab on which literally hundreds of devices are fabricated, for purposes of clarity the processing of only a single device will be shown and described.

The substrate 20 is placed in a suitable furnace apparatus, and an epitaxial layer 21 of very high resistivity P-type silicon is grown on the surface as by known vapor deposition techniques. A gaseous compound of silicon mixed with a controlled quantity of a gaseous compound of a conductivity type imparting material is reacted with hydrogen at the substrate surface to cause deposition of silicon lightly doped with the conductivity type imparting material. A layer 21 which is precisely controllable both as to thickness and as to resistivity and which is a continuation of the crystalline structure of the substrate 20 is thus deposited on the surface.

Immediately following this treatment and without the necessity for removing the substrate from the furnace, an N-type layer 22 is similarly grown on the P-type layer 21. According to known vapor deposition techniques a gaseous compound of an N-type conductivity imparting material is mixed in a controlled manner with the gaseous silicon compound in place of the compound of P-type conductivity imparting material. The N-type epitaxial layer is also precisely controlled as to thickness and resistivity, and in accordance with the teachings hereinabove is moderately doped to be of lower resistivity material than the P-type layer.

Figure 4:
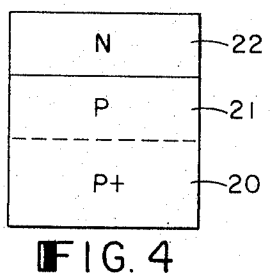

The single crystal structure produced by the epitaxial growth of the two layers on the heavily doped substrate, as illustrated in FIG. 4, is then treated to diffuse a P-type conductivity imparting material into a portion of the N-type layer 22. In order to diffuse the P-type conductivity imparting material only into the portion desired, known techniques of diffusing through an opening 25 in an adherent oxide coating 26 are employed.

An adherent non-conductive, protective coating of silicon oxide is formed on the surface of the silicon structure as by heating it in a wet oxygen atmosphere. The oxide coating is covered with a photo-resist solution, and the photo-resist is exposed to ultra-violet light through a mask shielding the area delineating the opening through which the conductivity type imparting material is to be diffused. The photo-resist on this area is thus not exposed to the light, and after the exposed portions are developed, the unexposed resist on the area is easily washed off while the exposed portions remain. The oxide coating unprotected by the resist is removed in an etching solution which does not attack the resist, thereby forming the opening 25 in the oxide coating 26. The previously exposed photo-resist is then dissolved to leave only the oxide coating with the opening of the desired configuration on the surface of the silicon.

The wafer is then treated in a diffusion furnace to diffuse a P-type conductivity imparting material through the opening 25 in the oxide coating and into a portion 27 of the N-type epitaxial layer 22. A graded P-type region is thus obtained in which the resistivity decreases with distance from the junction between the converted P-type region and the remaining portion of the N-type layer.

Figure 6:
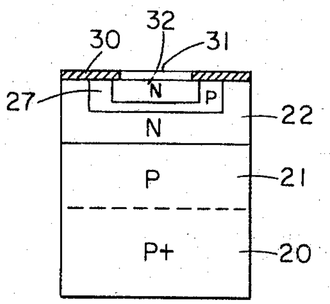
Figure 3:
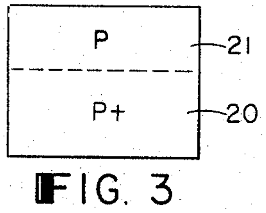

The silicon oxide coating is then reconstituted and the photo-resist masking and etching procedures repeated to produce a silicon oxide coating 30 having a smaller opening 31 therein, as illustrated in FIG. 6. An N-type conductivity type imparting material is diffused through the opening to reconvert a portion 32 of the second epitaxial layer to N-type conductivity. This region is also graded with a heavier concentration of conductivity type imparting material adjacent the surface and a lesser concentration at the junction with the unreconverted P-type region 27.

Figure 8:
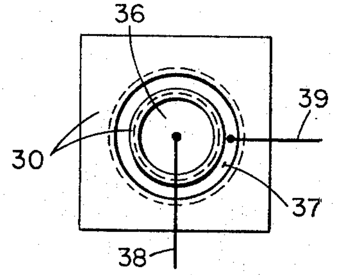
FIG. 8 is a plan view of a PNPN triode fabricated according to the method illustrated in FIGS. 2 through 7.
Figure 5:
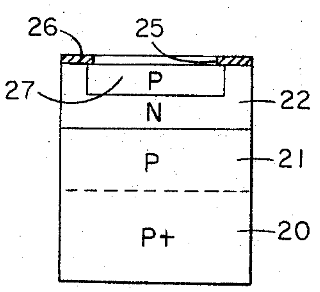

The oxide coating is further treated according to the above mentioned masking and etching techniques to produce an annular opening 35 therethrough which exposes an area of the surface of the diffused P-type region 27. FIG. 8 is a plan view of a device having such a configuration. The surface areas of the diffused N and P-type regions exposed at the openings 31 and 35 in the oxide coating 30 are metallized to produce ohmic contacts 36 and 37 as by coating with a thin film of aluminum according to known vacuum deposition, masking, and etching techniques. The junctions between the regions of different conductivity type (shown dotted in FIG. 8) lie beneath the protective oxide coating. Connections 38 and 39 are then made to the metallized area contacts 36 and 37, respectively. An ohmic connection 40 is also made to the degenerate P-type substrate 20. In effect this connection together with the heavily doped P-type substrate provides a low resistance electrode providing contact to the P-type region 21.

Figure 7:
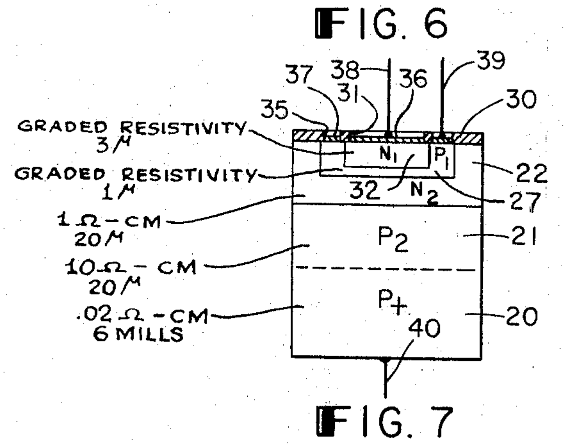

A PNPN triode fabricated as explained hereinabove provides a four-layer semiconductor switch in accordance with the invention. The thickness and resistivity profile of each of the four active layers in addition to other advantages due to the method of manufacture combine to provide a novel device with a useful combination of electrical characteristics. The use of a degenerate substrate as a starting material provides, in effect, a low resistance electrode of proper crystalline structure permitting the active layers to be fabricated within relatively thin epitaxial deposits on the substrate. In FIG. 7 which best illustrates the configuration of a PNPN triode according to the invention, the active layers have been given the same designations as in the schematic representation of FIG. 1.

The $P_2$ layer which is grown by epitaxial techniques is of extremely high resistivity in order to contribute to low emitter injection efficiency in the second transistor section and is made thin in order to contribute to low on-state resistance in the device. These characteristics could be optimized by making the $P_2$ layer extremely thin. However, if the thickness of the layer is small compared with a diffusion length, the density of N-type material minority carriers coming from the heavily doped P-type substrate will be high at the $N_2$–$P_2$ junction resulting in an increase in the emitter injection efficiency.

The $N_2$ layer is also grown by epitaxial techniques, thus permitting its resistivity and thickness to be controlled. A satisfactory ratio of resistivity between the $N_2$ and $P_2$ layers is obtained, thus producing a low emitter injection efficiency for the second transistor section consistent with a suitable value of device breakover voltage. The thickness is controlled to permit a low on-state resistance and at the same time contribute to a low transport factor in the second transistor section.

Formation of the $P_1$ and $N_1$ layers by double diffusion into the N-type epitaxial layer contributes to high emitter injection efficiency in the first transistor section and high off resistance in the device by virtue of the protected junctions $N_1$–$P_1$ and $P_1$–$N_2$ which are formed under the protective oxide coating. The controllability of diffusion techniques permits precise control of the thickness of the unconverted $N_2$ region and more particularly of the $P_1$ region. Double diffusion also provides a proper ratio of resistivities between the emitter and base regions $N_1$ and $P_1$ to produce a high emitter injection efficiency in the first transistor section.

In a typical PNPN triode according to the invention, the starting material was a degenerate substrate 20 of single crystal P-type silicon heavily doped with boron to provide a resistivity of approximately .02 ohm-centimeter. The substrate was approximately 18 mils square by 6 mils thick. An epitaxial layer 21 of P-type silicon lightly doped with boron was grown on the substrate. The layer was approximately 20 microns thick and of about 10 ohm-centimeters resistivity. Next, an N-type conductivity epitaxial layer 22 approximately 25 microns thick was grown on the P-type layer. The material was moderately doped with arsenic to provide a resistivity of about 1 ohm-centimeter.

Following the epitaxial growth processes, P and N-type regions were successively diffused into the N-type epitaxial layer. Boron was diffused through an 8 mil diameter circular opening 25 in an oxide coating 26 on the surface of the N-type layer to produce a diffused P-type region 27 forming a graded junction with the N-type layer. Phosphorous was then diffused through a 4 mil diameter circular opening 31 in the reconstituted oxide coating 30 to produce an N-type region 32 forming a graded junction with the P-type diffused region. The double diffusion into the N-type layer provided a diffused P-type region 27 about 1 micron thick and a double diffused N-type region 32 about 3 microns thick. The total thickness of the active layers on the P-type substrate was approximately 2 mils.

Gold was diffused into the device from the surface of the substrate opposite the surface on which the active layers were fabricated. The gold atoms provided recombination centers for the minority current carriers thus reducing their lifetime and consequently their diffusion length in the semiconductor material as well as the injection efficiency of the injecting junctions. In the active layers of devices according to the specific embodiment of the invention the concentration of gold was determined to be approximately $10^{16}$ atoms per cubic centimeter. The resulting diffusion length was about 10 to 20 microns which is of the order of the thickness of the $N_2$ region and of the $P_2$ region in the device.

What is claimed is:

1. A semiconductor device comprising
a body of semiconductor material including four zones of alternating conductivity type arranged in succession on a degenerate substrate of semiconductor material of very low resistivity of one conductivity type,
the first of said zones contiguous said substrate being of high resistivity semiconductor material of the one conductivity type,
the second of said zones forming a PN junction with said first zone and being of moderate resistivity semiconductor material of the opposite conductivity type, the moderate resistivity of the second of said zones being lower than the high resistivity of the first of said zones and being higher than the very low resistivity of said substrate,
the third of said zones forming a graded PN junction with said second zone and being semiconductor material of the one conductivity type, the resistivity of the third of said zones decreasing with distance from the junction with the second zone,
the fourth of said zones forming a graded PN junction with said third zone and being semiconductor material of the opposite conductivity type, the resistivity of the fourth of said zones decreasing with distance from the junction with the third zone,
the thickness of the degenerate substrate being greater than the total thickness of the four zones, and
ohmic connections to the substrate, the fourth zone, and the third zone, the second zone being free of any connection.

2. A semiconductor device comprising
a body of semiconductor material including four zones of alternating conductivity type arranged in succession,
the first of said zones being of high resistivity semiconductor material of one conductivity type,
the second of said zones being of moderate resistivity semiconductor material of the opposite conductivity type forming a PN junction with the first zone,
portions of said first and second zones each having a thickness of the order of one diffusion length of the minority carriers in the second zone, and the moderate resistivity of the second zone being lower than the high resistivity of the first zone,
the third of said zones being of semiconductor material of the one conductivity type forming a PN junction with the second zone.
a portion of said third zone having a thickness of the order of one tenth of a diffusion length of the minority carriers in the second zone,
the fourth of said zones being of semiconductor material of the opposite conductivity type forming a PN junction with the third zone,
the sheet resistance of said fourth zone being lower than that of said third zone, and
low resistance electrodes connected to the first, third, and fourth zones, the second zone being free of any connection.

3. A semiconductor device comprising
a body of semiconductor material including four zones of alternating conductivity type arranged in succession on a degenerate substrate of semiconductor material of very low resistivity of one conductivity type,
the first of said zones contiguous said substrate being a layer of high resistivity semiconductor material of the one conductivity type,
the second of said zones being a layer of moderate resistivity of the opposite conductivity type forming a PN junction with said first zone,
the moderate resistivity of the second of said zones being lower than the high resistivity of the first of said zones and being higher than the very low resistivity of said substrate, and portions of the first and second zones being of approximately the same thickness, the third of said zones being a layer of semiconductor material having diffused therein conductivity type imparting material of the one type and forming a PN junction with said second zone, the resistivity of the third of said zones decreasing with distance from the junction with the second zone, the fourth of said zones being a layer of semiconductor material having diffused therein conductivity type imparting material of the opposite type and forming a PN junction with said third zone, the resistivity of the fourth of said zones decreasing with distance from the junction with the third zone, a portion of the third zone being thinner than the portions of the first and second zones and thinner than the fourth zone, the thickness of the degenerate substrate being greater than the total thickness of the four zones, and terminal connections to the substrate and the fourth zone, and a control connection to the third zone, the second zone being free of any connection.

4. A semiconductor device comprising a body of semiconductor material including four zones of alternating conductivity type arranged in succession, the first of said zones being of high resistivity semiconductor material of one conductivity type, the second of said zones being of moderate resistivity semiconductor material of the opposite conductivity type forming a PN junction with the first zone, portions of said first and second zones each having a thickness of the order of one diffusion length of the minority carriers in the second zone, and the moderate resistivity of the second zone being lower than the high resistivity of the first zone, the third of said zones being of semiconductor material having diffused therein conductivity type imparting material of the one type and forming a graded PN junction with said second zone, the resistivity of the third zone decreasing with distance from the junction with the second zone, a portion of said third zone having a thickness of the order of one tenth of a diffusion length of the minority carriers in the second zone, the fourth of said zones being of semiconductor material having diffused therein conductivity type imparting material of the opposite type and forming a graded PN junction with said third zone, the resistivity of the fourth zone decreasing with distance from the junction with the third zone, the sheet resistance of said fourth zone being lower than that of said third zone, and low resistance electrodes connected to the first, third, and fourth zones, the second zone being free of any connection.

5. A semiconductor switching device including a single crystal degenerate substrate of silicon of very low resistivity of one conductivity type, a first zone of single crystal silicon of the one conductivity type contiguous said substrate having a thickness of the order of 20 microns and a resistivity of the order of 10 ohm-centimeters, a second zone of single crystal silicon of the opposite conductivity type forming a PN junction with said first zone, a portion of said second zone having a thickness of the order of 20 microns and a resistivity of the order of 1 ohm-centimeter, a third zone of single crystal silicon having diffused therein conductivity type imparting material of the one conductivity type and forming a graded PN junction with the second zone, the resistivity of the third zone decreasing with distance from the junction with the second zone, a portion of said third zone having a thickness of the order of 1 micron, a fourth zone of single crystal silicon having diffused therein conductivity type imparting material of the opposite conductivity type and forming a graded PN junction with the third zone, the resistivity of the fourth zone decreasing with distance from the junction with the third zone, said fourth zone having a thickness of the order of 3 microns, said four zones providing an integral body of single crystal silicon, and ohmic connections to the substrate, the fourth zone, and the third zone, the second zone being free of any connection.

References Cited by the Examiner

UNITED STATES PATENTS

| | | | |
|---|---|---|---|
| 3,197,681 | 7/1965 | Broussard | 317—235 |
| 3,220,896 | 11/1965 | Miller | 317—235 A |

OTHER REFERENCES

Semiconductors, by R. A. Smith, published by Cambridge University Press, 1959.

JOHN W. HUCKERT, *Primary Examiner.*

R. POLISSACK, *Assistant Examiner.*